US008653500B1

(12) United States Patent
Subramania et al.

(10) Patent No.: US 8,653,500 B1
(45) Date of Patent: Feb. 18, 2014

(54) VOLUME-SCALABLE HIGH-BRIGHTNESS THREE-DIMENSIONAL VISIBLE LIGHT SOURCE

(75) Inventors: Ganapathi Subramania, Albuquerque, NM (US); Arthur J. Fischer, Sandia Park, NM (US); George T. Wang, Albuquerque, NM (US); Qiming Li, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 288 days.

(21) Appl. No.: 13/231,156

(22) Filed: Sep. 13, 2011

Related U.S. Application Data

(60) Provisional application No. 61/382,073, filed on Sep. 13, 2010.

(51) Int. Cl.
| | | |
|---|---|---|
| *H01L 29/06* | (2006.01) | |
| *H01L 31/0328* | (2006.01) | |
| *H01L 31/0336* | (2006.01) | |
| *H01L 31/072* | (2012.01) | |
| *H01L 31/109* | (2006.01) | |

(52) U.S. Cl.
USPC .................................. 257/13; 257/79; 257/99

(58) Field of Classification Search
USPC .......................................................... 257/13
See application file for complete search history.

(56) References Cited

U.S. PATENT DOCUMENTS

| | | | |
|---|---|---|---|
| 6,869,330 B2 * | 3/2005 | Gee et al. ......................... 445/50 |
| 2009/0201960 A1 * | 8/2009 | Numata et al. .............. 372/43.01 |

OTHER PUBLICATIONS

K. Aoki, et al., Coupling of Quantum-Dot Light Emission with a Three-Dimensional Photonic-Crystal Nanocavity, Nature Photonics, vol. 2, Nov. 2008, pp. 688-692.
P.V. Braun and P. Wiltzius, Electrochemically Grown Photonic Crystals, Nature, vol. 402, Dec. 9, 1999, pp. 603-604.
C.M. Chuang, et al., Manipulation of Luminescence from CdSe Nanopraticles by Three-Dimensional Photonic Crystal, Journal of Applied Physics 97,096104 (2005).
H.W. Huang, et al., Efficiency Improvement of GaN-Based LEDs with a SiO2 Nanorod Array and a Patterned Sapphire Substrate, IEEE Electron Device Letters, vol. 31, No. 6, Jun. 2010, pp. 582-584.
C-Y Huang, et al., Light Extraction Enhancement for InGaN/GaN LED by Three Dimensional Auto-Cloned Photonics Crystal, Optics Express 23702, vol. 17, No. 26, Dec. 21, 2009.
S. John, Strong Localization of Photons in Certain Disordered Dielectric Superlattices, Physical Review Letters, vol. 58, No. 23, Jun. 8, 1987, pp. 2486-2489.
J-Y Kim, et al., Enhancement of Light Extraction from GaN-based Green Light-Emitting Diodes Using Selective Area Photonic Crystal, Applied Physics Letters 96, 251103 (2010).
C-F Lai, et al., Directional Light Extraction Enhancement from GaN-based Film-Transferred Photonic Crystal Light-Emitting Diodes, Applied Physics Letters 94, 123106 (2009).

(Continued)

*Primary Examiner* — Thien F Tran
(74) *Attorney, Agent, or Firm* — Kevin W. Bieg

(57) ABSTRACT

A volume-scalable, high-brightness, electrically driven visible light source comprises a three-dimensional photonic crystal (3DPC) comprising one or more direct bandgap semiconductors. The improved light emission performance of the invention is achieved based on the enhancement of radiative emission of light emitters placed inside a 3DPC due to the strong modification of the photonic density-of-states engendered by the 3DPC.

20 Claims, 13 Drawing Sheets

(56) References Cited

OTHER PUBLICATIONS

J. Lee, et al., GaN Light-Emitting Diode with Monolithically Integrated Photonic Crystals and Angled Sidewall Deflectors for Efficient Surface Emission, Applied Physics Letters 94, 101105 (2009).

Q. Li, et al., Dislocation Density Reduction in GaN by Dislocation Filtering Through a Self-Assembled Monolayer of . Silica Microspheres, Applied Physics Letters 94, 231105 (2009).

P. Lodahl, et al., Controlling the Dynamics of Spontaneous Emission from Quantum Dots by Photonic Crystals, Letters to Nature, Nature, vol. 430, Aug. 5, 2004, pp. 654-657.

K. McGroddy, et al., Directional Emission Control and Increased Light Extraction in GaN Photonic Crystal Light . Emitting Diodes, Applied Physics Letters 93, 103502 (2008).

T.N. Oder, et al., III-Nitride Photonic Crystals, Applied Physics Letters, vol. 83, No. 6, Aug. 11, 2003, pp. 1231-1233.

P.A. Shields, et al., Enhanced Light Extraction by Photonic Quasi-Crystals in GaN Blue LEDs, IEEE Journal of Selected Topics in Quantum Electronics, vol. 15, No. 4, Jul./Aug. 2009, pp. 1269-1274.

D. Shir, et al., Three Dimensional Silicon Photonic Crystals Fabricated by Two Photon Phase Mask Lithography, Applied Physics Letters 94, 011101 (2009).

G. Subramania, et al., Log-Pile TiO2, Photonic Crystal for Light Control at Near-UV and Visible Wavelengths, Materials Views, Adv. Mater. 2010, 22, pp. 487-491.

G. Subramania, et al., Optical Photonic Crystals Fabricated from Colloidal Systems, Applied Physics Letters, vol. 74, No. 26, Jun. 28, 1999, pp. 3933-3935.

G. Subramania, et al., Emission Modification of CdSe Quantum Dots by Titanium Dioxide Visible Logpile Photonic Crystal, Applied Physics Letters 95, 151101 (2009).

G. Subramania, et al., Nano-Lithographically Fabricated Titanium Dioxide Based Visible Frequency Three Dimensional Gap Photonic Crystal, Optics Express 13049, vol. 15, No. 20, Oct. 1, 2007, pp. 13049-13057.

T. Suzuki and P.K.L. Yu, Emission Power of an Electric Dipole in the Photonic Band Structure of the fcc Lattice, J. Opt. Soc. Am. B, vol. 12, No. 4, Apr. 1995, pp. 570-582.

J.J. Wierer, et al., InGaN/GaN Quantum-Well Heterostructure Light-Emitting Diodes Employing Photonic Crystal Structures, Applied Physics Letters, vol. 84, No. 19, May 10, 2004, pp. 3885-3887.

J. Wijnhoven and W.L. Vos, Preparation of Photonic Crystals Made of Air Spheres in Titania, Science, vol. 281, Aug. 7, 1998, pp. 802-804.

S. Wong, et al., Direct Laser Writing of Three-Dimensional Photonic Crystals with a Complete Photonic Bandgap in Chalcogenide Glasses, Adv. Mater. 2006, 18, pp. 265-269.

E. Yablonovitch, Inhibited Spontaneous Emission in Solid-State Physics and Electronics, Physical Review Letters, vol. 58, No. 20, May 18, 1987, pp. 2059-2062.

E.C. Nelson, et al., Epitaxial Growth of Three-Dimensionally Architectured Optoelectronic Devices, Nature Materials, vol. 10, Sep. 2011, pp. 676-681.

* cited by examiner

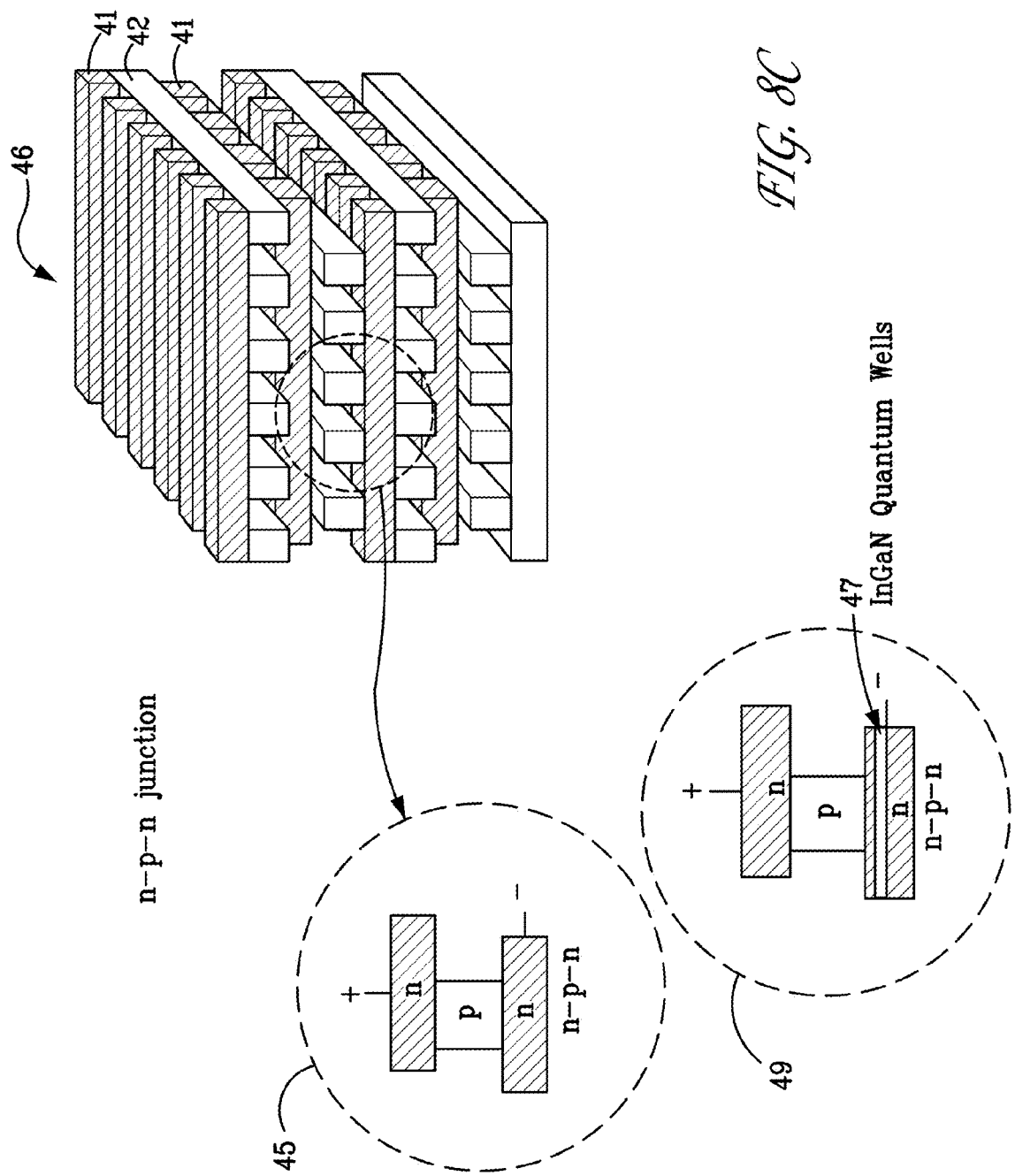

VOLUME-SCALABLE HIGH-BRIGHTNESS THREE-DIMENSIONAL VISIBLE LIGHT SOURCE

CROSS-REFERENCE TO RELATED APPLICATION

This application claims the benefit of U.S. Provisional Application No. 61/382,073, filed Sep. 13, 2010, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light sources and, in particular, to a volume-scalable high-brightness three-dimensional visible light source comprising a three-dimensional photonic crystal made of a direct bandgap semiconductor material.

BACKGROUND OF THE INVENTION

Photonic crystals (PC) are artificial structures comprised of alternate regions of high and low refractive index materials in one, two or three dimensions (3D) that can have a frequency gap or a photonic bandgap where electromagnetic modes are forbidden. In a 3DPC with a suitable geometry and material composition, one can obtain a 3D photonic bandgap where electromagnetic modes in all three dimensions are suppressed, creating an electromagnetic vacuum. See E. Yablonovitch, *Phys. Rev. Lett.* 58, 2059 (1987); and S. John, *Phys. Rev. Lett.* 58, 2486 (1987). This property of 3DPCs opens up new regimes of photon manipulation and light-matter interaction.

Inside a photonic bandgap, all radiative emission is suppressed while outside the gap one can obtain enhanced emission due to increased photonic density-of-states. See E. Yablonovitch, *Phys. Rev. Lett.* 58, 2059 (1987); and T. Suzuki and P. K. L. Yu, *Journal of the Optical Society of America B-Optical Physics* 12, 570 (1995). 3DPCs can thus make radiative processes preferable to other undesired radiative and non-radiative processes by suitably modifying the electromagnetic environment surrounding an emitter. For example, control of light emission has been previously demonstrated by embedding nano light sources, such as quantum dots, inside 3DPCs. See G. Subramania et al., *Applied Physics Letters* 95, 151101 (2009); K. Aoki et al., *Nature Photonics* 2, 688 (2008); C. M. Chuang et al., *Journal of Applied Physics* 97, 096104 (2005); and P. Lodahl et al., *Nature* 430, 654 (2004). This property can be particularly useful for enhancing the performance of light-emitting-diodes (LEDs) especially at wavelengths in the green, yellow, and red where efficiency is particularly low. For example, group III nitrides are important semiconductors currently used or being explored for use in LEDs, laser diodes, photo detectors, and photovoltaic devices. Thus far most such efforts involving group III nitrides have focused on two-dimensional photonic crystals (2DPCs) as they are easier to fabricate. For example, group III nitride based 2DPCs have been utilized to improve light extraction efficiencies and to achieve highly directional emission. See J. Wierer et al., *Applied Physics Letters* 84, 3885 (2004); J.-Y. Kim et al., *Applied Physics Letters* 96, 251103 (2010); C.-Y. Huang et al., *Opt. Express* 17, 23702 (2009); P. A. Shields et al., *IEEE Journal of Selected Topics in Quantum Electronics* 15, 1269 (2009); H. Huang et al., *IEEE Electron Device Letters* 31, 582 (2010); C. F. Lai et al., *Applied Physics Letters* 94, 3 (2009); K. McGroddy et al., *Applied Physics Letters* 93, 103502 (2008); J. Lee et al., *Applied Physics Letters* 94, 101105 (2009); and T. N. Oder et al., *Applied Physics Letters* 83, 1231 (2003). However, 2DPCs typically offer light control along only one plane but do not offer complete three-dimensional light control.

Therefore, a need remains for a true 3DPC comprising a direct bandgap semiconductor, such as a group III nitride semiconductor. Integrating 3DPCs with group III nitride or other direct bandgap semiconductor devices according to the present invention will enable new strategies for enhancing the device performance.

SUMMARY OF THE INVENTION

The present invention is directed to a light source comprising a three-dimensional photonic crystal having a photonic density-of-states, wherein the three-dimensional photonic crystal comprises at least one semiconductor with a direct bandgap and wherein at least one p-n junction is located within the three-dimensional photonic crystal; and electrical contacts configured to produce electrical biasing of the at least one p-n junction to provide emission of light by recombination of electrical carriers at the p-n junction; wherein the emission comprises a light spectrum suitable for modification by the density-of-states of the three-dimensional photonic crystal. The three-dimensional photonic crystal can comprise a face-centered-cubic (FCC), inverse FCC, diamond, inverse diamond, simple cubic (SCC), inverse SCC, body-centered-cubic (BCC), inverse BCC, or hexagonal (HCP) crystal structure. For example, the photonic crystal can comprise an opal, an inverse opal, a logpile, or an inverse logpile crystal structure. The at least one semiconductor with a direct bandgap can comprise a group III nitride semiconductor. The at least one semiconductor with a direct bandgap can comprise GaN, AlGaN, InGaN, InN, AlN, GaAs, InGaAs, AlGaAs, CdS, CdSe, ZnS, ZnSe, InP, InAs, GaSb, InSb, or ZnO. The three-dimensional photonic crystal can further comprise a phosphor, such as CdS, CdSe, PbS, PbSe, ZnSe, or ZnS. The photonic crystal can further comprise a defect cavity in the three-dimensional photonic crystal providing a transmission mode within a photonic bandgap of the photonic crystal.

For example, the three-dimensional photonic crystal can comprise a logpile structure. The logpile structure can comprise a p-n junction at a desired location between a plurality of n-type layers and a plurality of p-type layers to provide a bulk p-n junction. The logpile structure can comprise alternating n-type and p-type semiconductor logpile layers that can be electrically biased to provide at least one p-n diode junction or at least one provide n-p-n transistor-like junction. At least one of the n-type or p-type layers can further comprise a quantum well layer. The logpile structure can comprise n-type or p-type semiconductor rods conformally coated with a p-type or n-type semiconductor layer, respectively. The conformal p-type or n-type semiconductor layer can further comprise a quantum well layer or a plurality of quantum dots.

As an example of the present invention, 9-layer logpile 3DPCs composed of single crystalline gallium nitride (GaN) nanorods, ~100 nm in size with lattice constants of 260 nm, 280 nm, and 300 nm with photonic bandgap in the visible were fabricated. This GaN photonic crystal structure was created through a combined approach of a layer-by-layer template fabrication technique and selective metal organic chemical vapor deposition (MOCVD). The GaN 3DPC exhibited a stacking direction bandgap characterized by a strong reflectance between 380 nm and 500 nm wavelength. By introducing a 'line-defect' cavity in the 5$^{th}$ (middle) layer of the 3DPC a localized transmission mode with a quality factor of 25-30 was also observed within the photonic bangdgap. The realization of a group III nitride 3DPC with uniform features and a bandgap in the visible frequency is an important step towards realizing complete control of the electromagnetic environment for group III nitride based optoelectronic devices.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 5 shows optical reflectance spectrum in the visible for 9-layer GaN logpile for input polarization parallel (top) and perpendicular (bottom) to the top layer rods.

FIG. 8 illustrates some electrical injection schemes for various embodiments. FIG. 8c shows an electrical injection scheme comprising an n-p-n transistor-like junction.

DETAILED DESCRIPTION OF THE INVENTION

The present invention is directed to a high brightness, high efficiency, scalable and electrically driven light source comprising a three-dimensional photonic crystal (3DPC) comprising one or more direct bandgap semiconductors. The improved light emission performance of the invention is achieved based on the enhancement of radiative emission of light emitters placed inside a 3DPC due to the strong modification of the photonic density-of-states (PDOS) engendered by the 3DPC.

Figure 1:
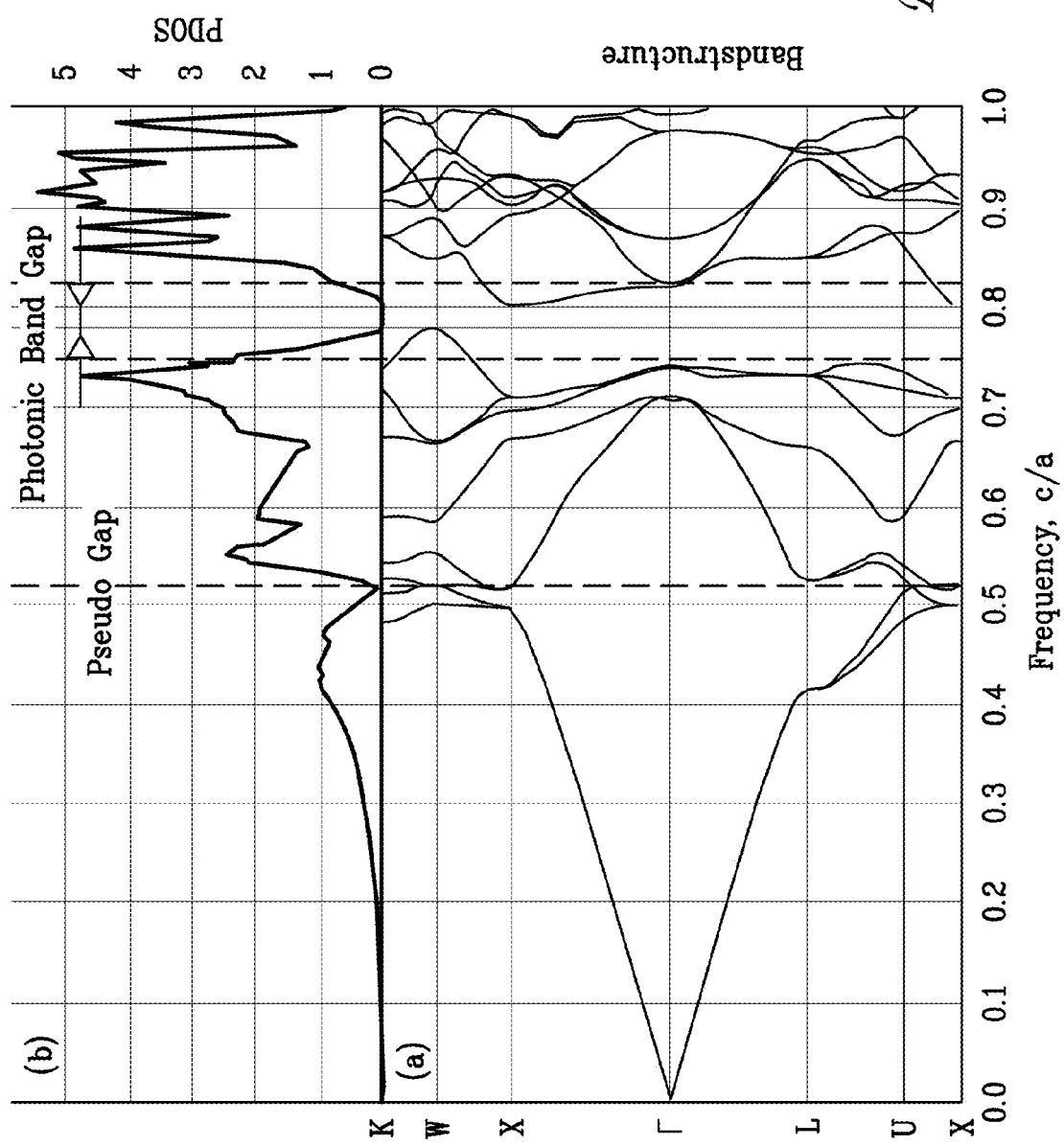
FIG. 1 illustrates a photonic band structure and corresponding photonic density-of-states. See T. Suzuki and P. K. L. Yu, *Journal of the Optical Society of America B-Optical Physics* 12, 570 (1995).

The radiative rate of a light emitter (e.g., atoms, quantum dots, etc.) is given by the Fermi golden rule:

$$\frac{1}{\tau_r} = \frac{\pi \omega \mu^2}{3\varepsilon_0 \hbar} \rho(\omega)$$

that indicates a proportionality to the PDOS ($\rho(\omega)$). In free space, $\rho(\omega)$ is isotropic with a square law dependence ($\omega^2/\pi^2 c^3$). But inside a 3DPC, due to its photonic band structure, the PDOS can be position dependent and can vary dramatically with frequency from being either zero or several times larger than in free space. This is illustrated in FIG. 1, which shows a photonic band structure and the corresponding PDOS. The shaded region in the band structure shown in FIG. 1a is a frequency region of a complete photonic bandgap, where the PDOS is near zero. At the edges of the photonic band gap there is an enhancement in the PDOS with respect to free space, as seen in FIG. 1b.

The present invention is directed to an electrically driven 3DPC-based light source comprising a direct bandgap (DBG) semiconductor that can be doped 'p' or 'n' type to create a p-n diode junction within the 3DPC structure. Upon electrical biasing, the electrons and holes recombine at the junction resulting in the emission of light within the volume of the 3DPC. The choice of the DBG semiconductor material depends on the emission wavelength that is desired. Examples of DBG semiconductor materials that may be employed in various embodiments include but are not restricted to GaN, AlGaN, InGaN, InN, AlN, GaAs, InGaAs, AlGaAs, CdS, CdSe, ZnS, ZnSe, InP, InAs, GaSb, InSb, and ZnO. Other direct bandgap semiconductors not listed here can also be employed in embodiments of this invention. The DBG semiconductor is preferably a group III nitride semiconductor. Some parameters of the 3DPC (e.g., crystal structure, lattice constant, refractive index contrast) can be chosen to match the emission from the DBG to the large PDOS at the band edges of the 3DPC. A variety of photonic crystal structures can be employed in embodiments of this invention, including but not restricted to face-centered-cubic (FCC), inverse FCC, diamond, inverse diamond, simple cubic (SCC), inverse SCC, body-centered-cubic (BCC), inverse BCC, and hexagonal (HCP). An inverse crystal structure is one in which a background matrix is made of a high-refractive-index material and the lattice "atoms" are made of low-index material. Some exemplary crystal structures include but are not restricted to opal, inverse opal, logpile, and inverse logpile. The lattice constant for a particular embodiment depends on the wavelength of operation desired for that embodiment. For example, the lattice constant can be selected from a range from approximately 100 nm to approximately 3000 nm for wavelengths of operation from the ultraviolet (UV) to near-infrared (NIR) wavelength regime to provide a visible light source. Other dimensions can be selected for operation at other wavelengths.

Figure 2:
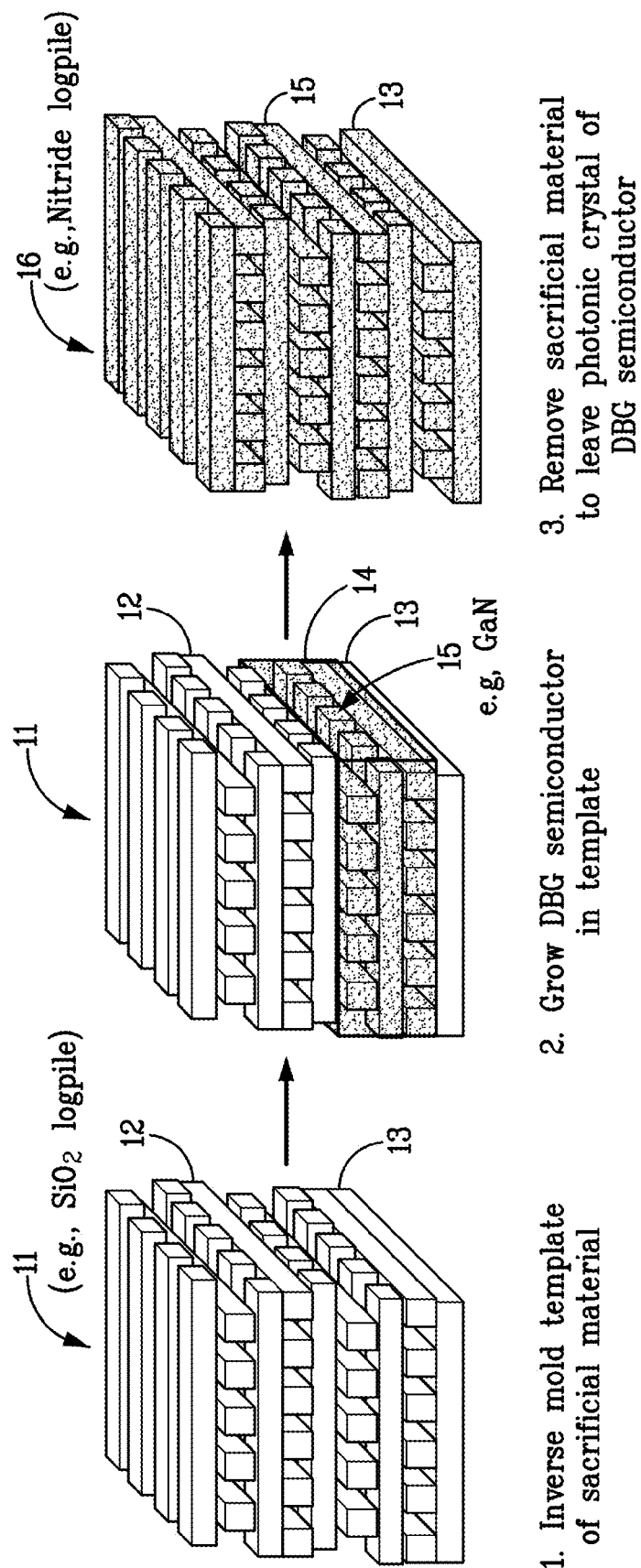
FIG. 2 illustrates a method to fabricate a DBG semiconductor logpile structure.

Some embodiments can be fabricated in the manner shown in FIG. 2. At step 1, a template 11 which is the 'inverse mold' of the desired 3DPC 16, determined from design considerations, is first formed from a sacrificial material 12 atop a suitable substrate 13. A suitable sacrificial material is one that has two principal characteristics: 1) sufficient thermal stability and chemical stability to remain substantially intact under the growth conditions employed for the growth of the DBG semiconductor, and 2) chemical reactivity sufficiently different from that of the DBG semiconductor to allow selective removal of the sacrificial material after DBG semiconductor growth. Examples of some sacrificial materials suitable for use with some compound semiconductor materials, such as group III-V materials, include but are not restricted to $SiO_2$, $SiN_x$, $SiO_xN_y$, $SiO_xH_y$, and $SiO_xN_yH_z$. Other materials can be used, provided they can be fabricated into a template structure that is compatible with a desired semiconductor's growth process and that can be selectively removed to leave the DBG semiconductor structure intact. For example, the template 11 can comprise a logpile of the sacrificial $SiO_2$, as shown. The template 11 can comprise an open interconnected volume that provides a continuous porous path from the top of the mold to a bottom seed layer 14 which interfaces with the template. Therefore, the inverse mold can be formed on top of a suitable substrate which has a surface comprising at least in part the thin seed layer 14 (typically from approximately 100 nm to a few microns, although thinner and thicker seed layers can be used) of the DBG semiconductor material 15 to be grown through the inverse mold template 11, as shown at step 2. The DBG material 15 can be grown using a variety of processes, including but not restricted to metallorganic chemical vapor deposition (MOCVD), other gas-phase deposition processes, and electrodeposition processes. For example, the DBG semiconductor material can be GaN grown by MOCVD. After a desired thickness of the DBG material 15 has been grown, the sacrificial template material 12 can be removed to leave the 3DPC 16 of DBG semiconductor material 15 on the substrate 13, as shown at step 3. For example, the 3DPC can be a GaN logpile.

For example, to fabricate a III-nitride semiconductor logpile, first a template of a 3D photonic crystal with a suitable photon density-of-states is fabricated using a sacrificial material, such as $SiO_2$, on a substrate appropriately prepared (for example, by growth of a III-N epilayer as a nucleation/seed layer) for the growth of the semiconducting III-nitride materials. The open regions of the template can be filled with III-nitride material using selective semiconductor growth. The properties of the III-nitride material at various points in the nitride logpile structure can be controlled through changes to the gas flow, gas composition, gas pressure, and growth temperature. After growth of the group III nitride, the $SiO_2$ template can be removed using a selective chemical etch. For example, a sacrificial template comprising $SiO_2$ can be removed by etching in an HF solution when the III-nitride material displays sufficiently low etch rates in the HF solution to permit selective etching of the $SiO_2$ relative to the III-nitride material.

However, fabrication of 3DPCs that can operate in the visible has been challenging due to the sub-micrometer periodicity and feature sizes involved as well as limited availability of high refractive index materials. Early approaches to visible 3DPCs were based on self-assembly of submicron spheres which, however, are plagued by numerous unintentional defects resulting in PCs unsuitable for device fabrication. See G. Subramania et al., *Applied Physics Letters* 74, 3933 (1995); J. E. G. J. Wijnhoven and W. L. Vos, *Science* 281, 802 (1998); and P. V. Braun and P. Wiltzius, *Nature* 402, 603 (1999). A lithographic approach enables the fabrication of high quality 3DPCs, as has been demonstrated by $TiO_2$ based visible logpile 3DPCs. See G. Subramania et al., *Optics Express* 15, 13049 (2007); and G. Subramania et al., *Advanced Materials* 22, 487 (2010). In this fabrication method, each layer can be patterned in a resist using electron beam lithography, which is then transferred to the underlying material (e.g., $TiO_2$) via dry etch using the resist as a mask. This method cannot be directly applied to the fabrication of a GaN-based 3DPC because of a lack of simple low temperature deposition methods as well as strong resistance to dry chemical etching of GaN. However, these problems can be overcome by using a templated growth method wherein GaN is introduced epitaxially into an inverted template of a logpile PC composed of $SiO_2$. A larger number of logpile layers can also be achieved by using approaches like holography or laser direct write. See D. Shir et al., *Applied Physics Letters* 94, 011101 (2009); and S. Wong et al., *Advanced Materials* 18, 265 (2006).

Figure 3:
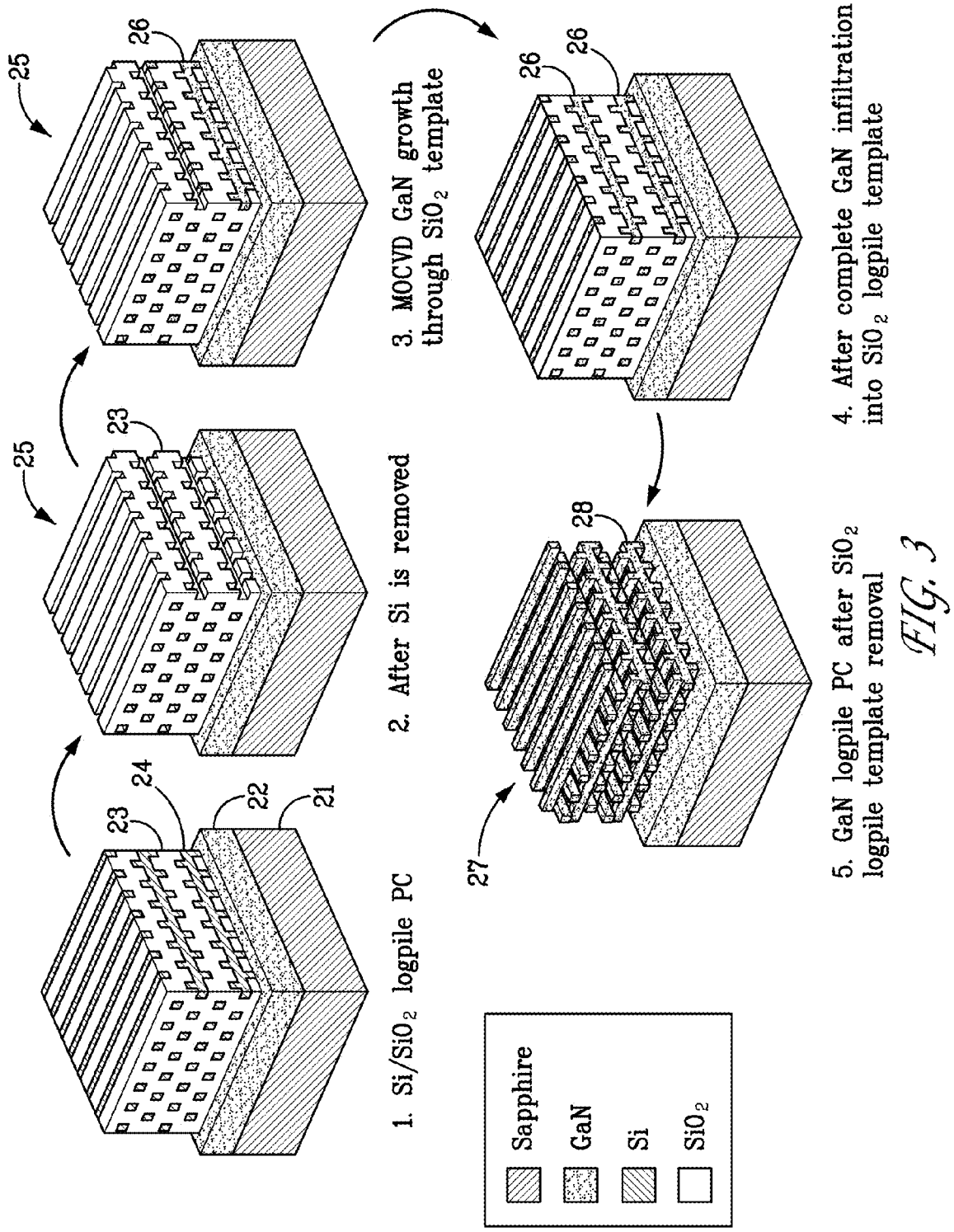
FIG. 3 is a schematic illustration of the fabrication of a GaN logpile from a template of a Si/SiO$_2$ logpile.
Figure 4:
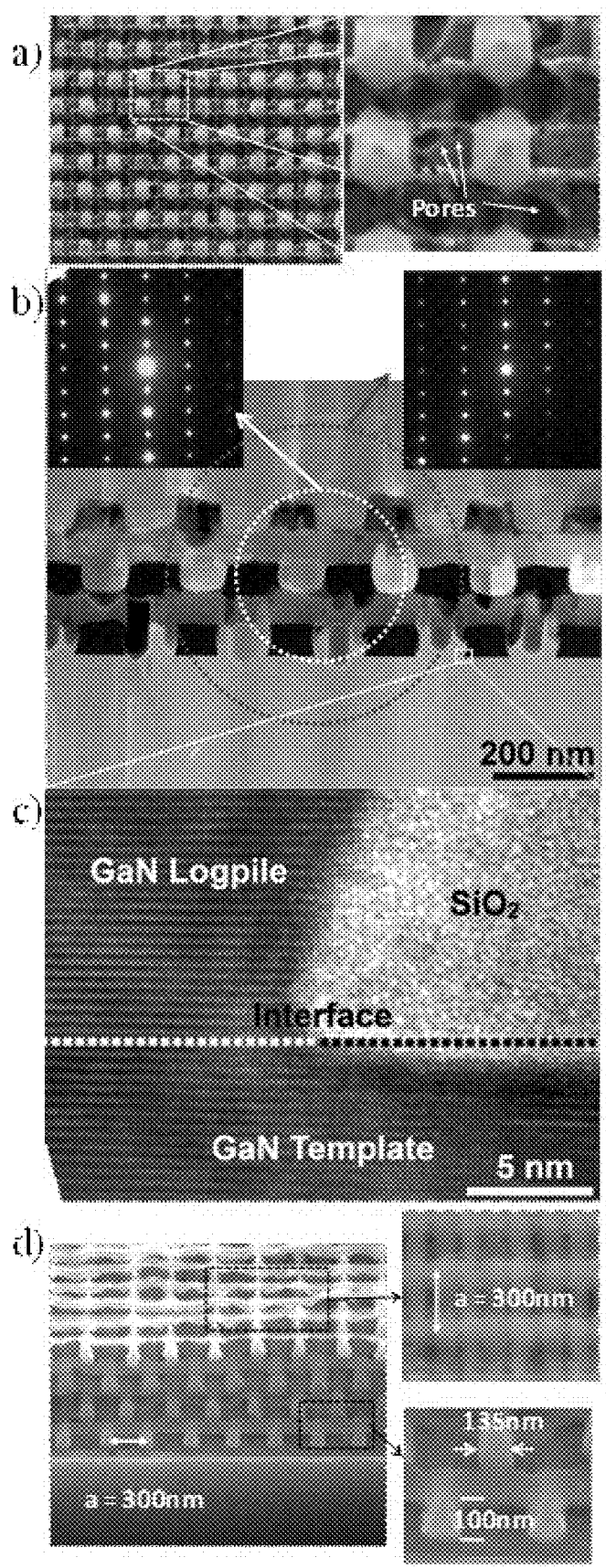
FIG. 4a is a SEM image of GaN logpile without optimal growth conditions showing large pores resulting from the 3D growth mode.
FIG. 4b is a cross-section TEM image of a 5-layer GaN logpile structure. Inset on the right-hand-side (r.h.s.) shows an electron diffraction pattern from the region indicated by the large dotted circle and the l.h.s. inset shows the diffraction pattern from the small dotted circle region.
FIG. 4c is a HRTEM image of region indicated by the small white rectangle in FIG. 4b showing the growth of GaN at the interface between the SiO$_2$ logpile template and the bottom GaN template epitaxial layer.
FIG. 4d is a cross-section SEM image of a 9-layer GaN logpile with a 300 nm lattice constant and rod height of 100 nm at a lower pressure optimal growth conditions to enable nucleation on the GaN epi-layer resulting in a 2D growth mode. The top r.h.s. image shows an enlarged top view and the bottom image shows an enlarged section of the perspective view of regions indicated by the dotted black boxes. The width of the rod was approximately 135 nm.

The 3DPC of the present invention can comprise a 3-D logpile. In the following exemplary description of a logpile embodiment, the DBG semiconductor is described as GaN, but other DBG semiconductors are also suitable for this and other logpile-based embodiments. A schematic illustration of an exemplary GaN logpile fabrication process is shown in FIG. 3. As shown at step 1, the fabrication can start with a 2-inch c-plane sapphire wafer 21 with ~2 μm thick GaN epitaxial layer 22 that provides a seeding layer for subsequent GaN PC growth. A logpile structure composed of stacked rods of $SiO_2$ 23 and Si 24 can be fabricated using a multilevel electron beam direct write approach. See G. Subramania et al., *Optics Express* 15, 13049 (2007). By immersing the Si/$SiO_2$ logpile in aqueous KOH solution (20 wt %) at room temperature, the silicon 24 can be selectively removed to leave behind a $SiO_2$ logpile template 25, as shown at step 2. The logpile template 25 comprises a continuous network of connected voids that provides a path for the metal organic precursors of the MOCVD process to transport to the bottom GaN seeding layer 22. During the GaN logpile growth, typical conditions for growing planar GaN lead to a 3D growth of GaN 26 inside the $SiO_2$ logpile 25. However, islands with a wide distribution in height can form on the seeding layer during the 3D growth. When these GaN islands reach the surface of a $SiO_2$ logpile layer, the surface is too rough to coalesce into a planar thin film, resulting in a structure with large pores, as shown in FIG. 4a. Therefore, a special growth technique was developed to promote a uniform two-dimensional growth mode. Reducing the growth pressure is efficient for achieving 2D growth in the $SiO_2$ logpiles. This growth condition can comprise flowing 100 sccm of $H_2$ gas through a tri-methylgallium (TMGa) bubbler held at −5° C. with $NH_3$ flow rate maintained at 4 SLM. The GaN can be grown at a temperature of ~1050° C. and growth pressure ranging from 7 Torr to 30 Torr using $H_2$ and $N_2$ as carrier gases. Under these conditions, GaN selectively grows through the SiO$_2$ logpile template at a growth rate of approximately 1 μm per hour, enabling complete GaN infiltration into the SiO$_2$ logpile template, as shown at step 4. The SiO$_2$ template can then be removed with a suitable etchant to provide the logpile photonic crystal 27 comprising stacked GaN rods 28, as shown at step 5.

FIG. 4*b* shows a cross sectional z-contrast scanning transmission electron micrograph (TEM) image of GaN grown through a 5-layer SiO$_2$ logpile template. The GaN growth was continued after the logpile growth was complete to coalesce a ~2 μm-thick GaN layer over the GaN logpile. The electron diffraction pattern, shown in the top left inset in FIG. 4*b*, was acquired selectively from a small logpile region (indicated by the small dotted circle) and shows a single set pattern, indicating the single crystalline nature of the GaN logpile region. The lattice spacing determined from the electron diffraction pattern matched the lattice constant of c-plane GaN (5.178 A) and m-plane GaN (3.189 A). An electron diffraction pattern (top right inset in FIG. 4*b*) was also collected from a larger region (indicated by the larger dotted circle) including the bottom GaN seeding layer, the logpile, and the top coalesced region. This revealed a pattern identical to that from the logpile region, indicating that the logpile assumes a homoepitaxy relationship with the underlayering GaN seeding layer. To further confirm the homoepitaxy relationship, high resolution TEM images were taken at the interfacial region between GaN logpile, seeding GaN underlayer, and SiO$_2$ logpile rod templates, as highlighted by the small white rectangle in FIG. 4*b*. The corresponding high resolution TEM (HRTEM) image (shown in FIG. 4*c*) shows that the GaN logpile lattice aligns very well with the GaN seed layer with no sign of grain boundaries. FIG. 4*b* also reveals small pores with two salient features: 1) the pores only appear near the interface between Ga-polar c-plane GaN logpile and SiO$_2$, and 2) the pores shows hexagonal facets as also seen in the plan view SEM image in FIG. 4*a*. These features suggest that anisotropic thermal decomposition under a growth condition involving high temperature and H$_2$ leads to the pore formations and are not the result of defects in the SiO$_2$ logpile template.

Using a similar method, another GaN logpile sample was fabricated through a 9-layer SiO$_2$ template. In this case, the GaN layer was not overgrown in order to have access for selective dissolution of the SiO$_2$ template using 6:1 buffered oxide etchant, leaving a high index contrast ratio GaN/air logpile PC for subsequent optical measurements. FIG. 4*d* shows scanning electron microscope (SEM) images of a tilted cross section view image of a GaN logpile with a lattice constant of 300 nm after the SiO$_2$ was removed. The SEM image shows that the GaN logpile rods were formed with excellent alignment between the successive layers. The images on the right show an enlarged view of the top surface with the perspective indicated by the black dotted box in the left image. The topmost (9$^{th}$) layer appears thinner than the other layers because the growth process was terminated before sufficient thickness was achieved. Since each logpile layer is only 100 nm thick, stopping the growth at the exact thickness desired can be challenging. This problem can be addressed by evaluating and optimizing the growth time using test samples. Alternatively, for large area samples, the GaN layer can be overgrown past the top logpile layer and then polishing back to the top layer. Polishing the top layer can also provide a high optical quality top interface.

Figure 5A:
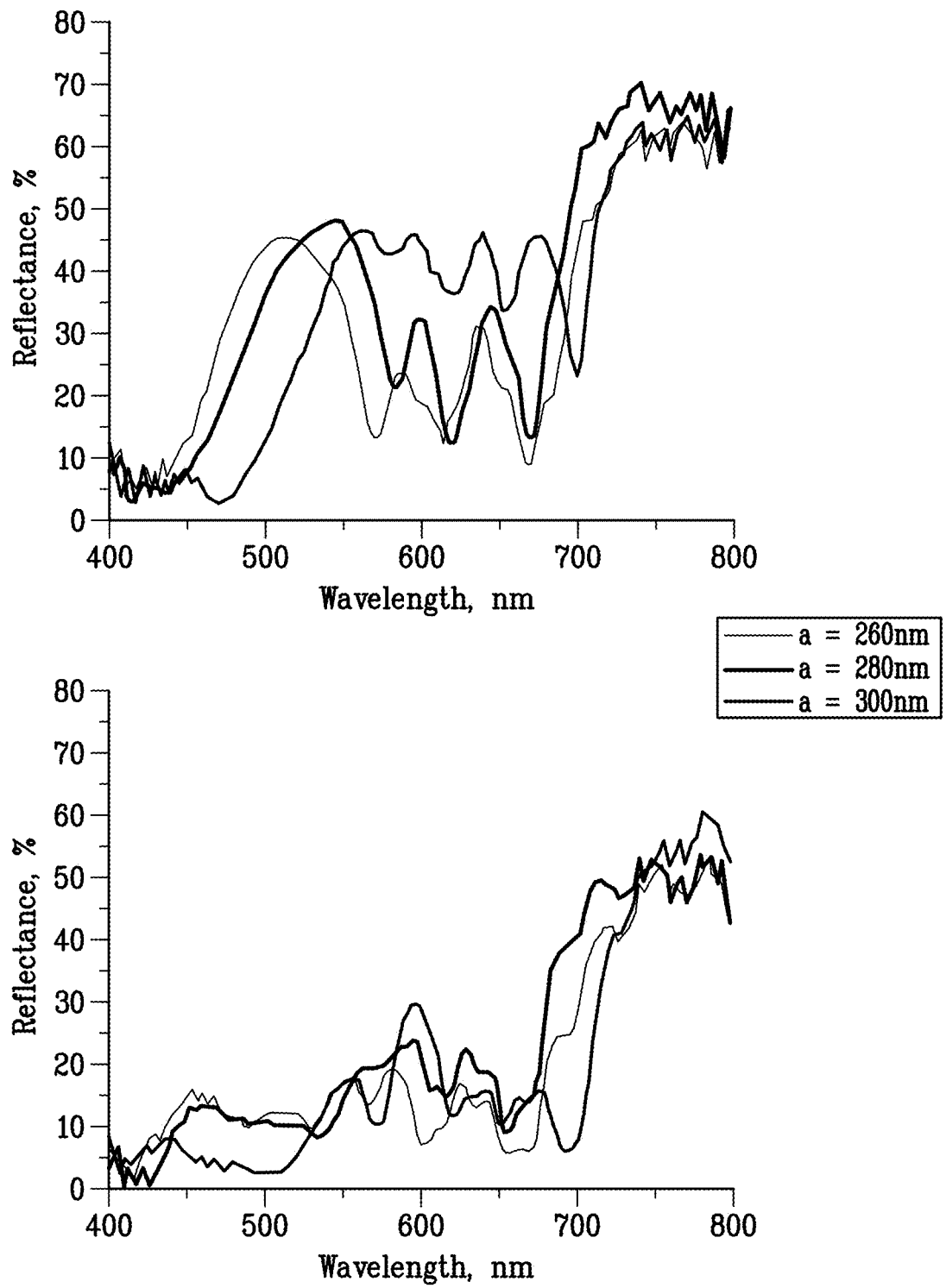
FIG. 5a shows the reflectance response with SiO$_2$ background still in place.

Different lattice constant logpile structures (a=300 nm, a=280 nm and a=260 nm) were fabricated and optical reflectance and transmission measurements were performed to characterize the photonic bandgap of the fabricated logpile structures along the stacking direction. Additionally, a polarizer was introduced in the input beam path to measure the polarization dependence of the reflectance spectra on the orientation of the terminating layer, which has been observed in previously fabricated logpile PCs. See G. Subramania et al., *Optics Express* 15, 13049 (2007); and G. Subramania et al., *Advanced Materials* 22, 4180 (2010). The reflectance spectrum of the GaN logpile 3DPC was measured in the visible region between the wavelengths of 400-800 nm before and after the SiO$_2$ template was removed to study the effect on the template. For the case where the SiO$_2$ template was still present, for both input light polarizations, the reflectance spectra (FIG. 5*a*) show broad peaks emerging near 680 nm-700 nm and extending towards longer wavelengths, as well as oscillations at shorter wavelengths. The rising edges of the broad peaks correspond to the upper band edge along the stacking directions while the oscillations correspond to higher band features of the GaN logpile before template removal. The parallel polarization case shows a maximum reflectance value of ~70% and the perpendicular polarization ~60% for all lattice constants and the band edge for the a=260 and 280 nm show a blue shift of 20 nm compared to the a=300 nm lattice.

Figure 5B:
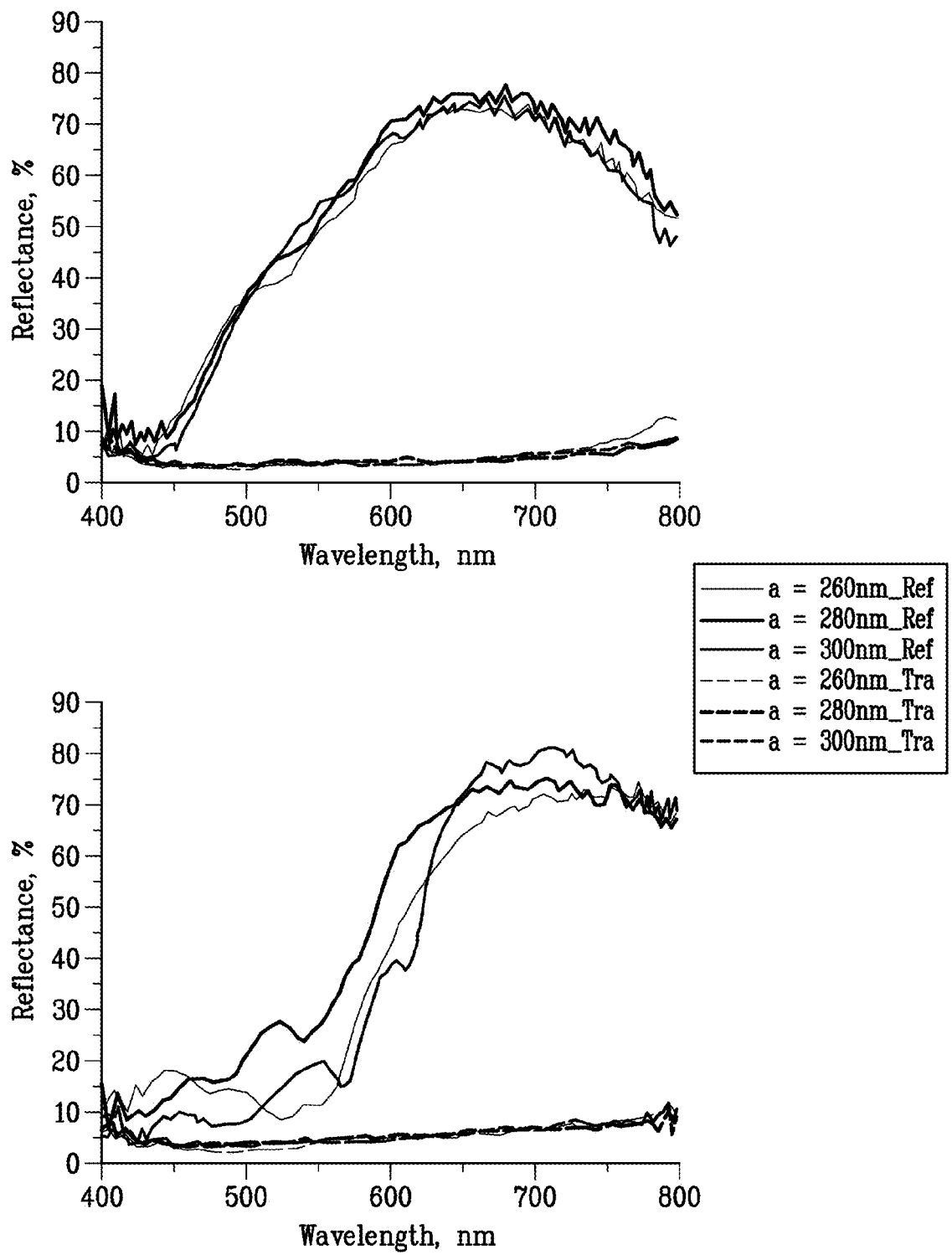
FIG. 5b shows the reflectance (solid) and transmission (dotted) response after the SiO$_2$ has been removed showing a bandgap in the visible.

Upon removal of the template, the reflectance response for both polarizations (FIG. 5*b*, solid curves) shows a considerable blue shift, which is expected since template removal reduces the effective refractive index of the entire 3DPC. The reflectance spectra for the parallel polarization show a broad peak corresponding to the stacking bandgap, spanning across the measurement region with a maximum reflectance of 75%, while perpendicular polarization spectra show an upper band edge near 550 nm wavelength followed by a sharp rise to about 70-80% reflectance. Based on previous measurements made on a visible logpile PC with TiO$_2$, which has a similar refractive index with GaN, one would expect that upon template removal, the reflectance spectra in addition to blue shifting should exhibit higher reflectivity as well as similar spectral overlap. See G. Subramania et al., *Advanced Materials* 22, 487 (2010). Consequently, the measured transmission response (FIG. 5*b*, dashed curves) reveals low transmission (<10%) for both polarizations.

Figure 5C:
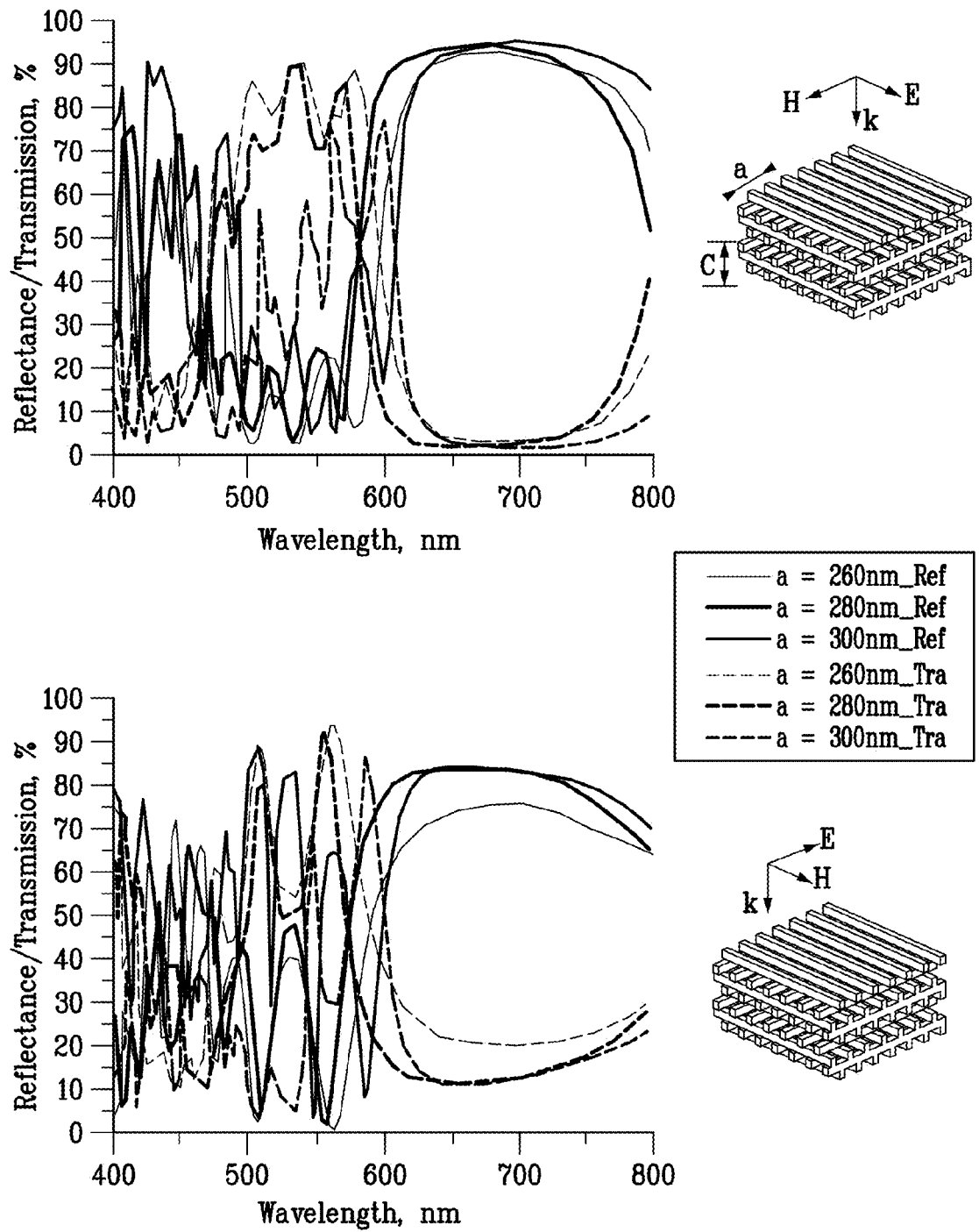
FIG. 5c shows the finite difference time domain (FDTD) simulation response of the modeled logpile structure without the back ground SiO$_2$.

A finite difference time domain (FDTD) simulation was performed of a 5-layer GaN logpile without the SiO$_2$ background to obtain reflectance spectra for the three different lattice constants with rod width ~0.4 a-0.45 a (based on SEM image measurement) and height of each layer to be nominally ~100 nm (measured template thickness of each layer). Simulations were performed using the OptiFDTD software from Optiwave® assuming a material refractive index (n) of 2.5. A broad band planewave source centered at 600 nm wavelength with FWHM of 400 nm was used as the excitation source with 10 nm×10 nm×10 nm spatial grid with periodic and perfectly matched layer boundary conditions in the lateral directions and normal direction respectively. The simulations revealed two interesting aspects. First, the simulated spectra (FIG. 5*c*) show very little spectral shift between the three different lattice constants for both polarizations, as observed in the experimental spectra. The lack of the expected proportional shift in the spectra with lattice constant can be attributed to the difference in the ratios of vertical to horizontal lattice constants (c/a) (see FIG. 5 logpile cartoon) between the three different lattice constant devices. This occurs due to processing constraints whereby the rod heights cannot be changed in proportion with the lattice constants when fabricated on the same substrate. As a result, the decrease (increase) in lateral lattice constant (a) which would result in a blue (red) shift of the bandgap is somewhat compensated for by the red (blue) shift effect due to increase (decrease) in vertical lattice constant (c). A shift in the bandgap that is proportional to the lattice constant can be achieved by fabricating different lattice constant structures on different wafers that will allow for different rod heights to maintain the c/a ratio constant, but at the expense of processing complexity. Second, the simulated reflectance magnitude is somewhat higher than that observed in the experiment. For the parallel and perpendicular polarizations, ~90% and 75-83% was obtained for the simulated spectra compared to ~75% and 70-80% for the experimental spectra, respectively. There was a ±5% variation in the measured value of reflectance and transmission arising from the difference in the location of the measurement spot on the structure as well as errors arising from focusing of the microscope objective used for microspectroscopy. Additionally, the simulated spectra also show higher order peaks not observed in the experiment. This was also apparent when comparing the transmission response for both polarizations with the simulated spectra. Since the cross-section TEM measurement reveals single crystalline GaN, these differences are unlikely due to absorption as the wavelengths are well below the absorption edge of GaN. These observed differences in magnitude and shorter wavelength features between the experimental and FDTD simulated spectra can be attributed to scattering behavior arising from any or a combination of the following reasons: 1) As seen from the SEM image (FIG. 4b), the top layer is not fully formed and exhibits roughness which can significantly affect the coupling of incoming light and reduce reflectance and transmission due to scattering. 2) The small pores at the GaN/SiO$_2$ interface described earlier can also be a source of scattering. 3) The GaN logpile layers are under compressive stress which after the removal of the template might lead to warping and internal cracks during stress release. This can be minimized by introducing stress release trenches using focused ion beam (FIB) and/or further optimizing growth. 4) GaN naturally grows with hexagonal symmetry while the logpile has square symmetry which can lead to roughness on either of the logpile rods depending on the orientation of the rods to the underlying epitaxial seeding layer. These non-idealities can be potential sources of scattering that can significantly affect the higher order peaks in addition to the reflectance/transmission magnitudes. Optimization of epitaxial growth can improve the optical response.

Notwithstanding some of the non-idealities and imperfections, the SEM and TEM images and the optical response described above clearly indicate a GaN-based logpile photonic crystal with a bandgap in the visible region can be obtained using this fabrication method. Such logpiles can enable GaN 3DPC based solid state lighting devices comprising active p-n junctions. 3DPCs, especially those with the potential for a full 3D gap like these logpile structures, can dramatically enhance light emission by enhancing the PDOS at the photonic band edges.

Figure 6A:
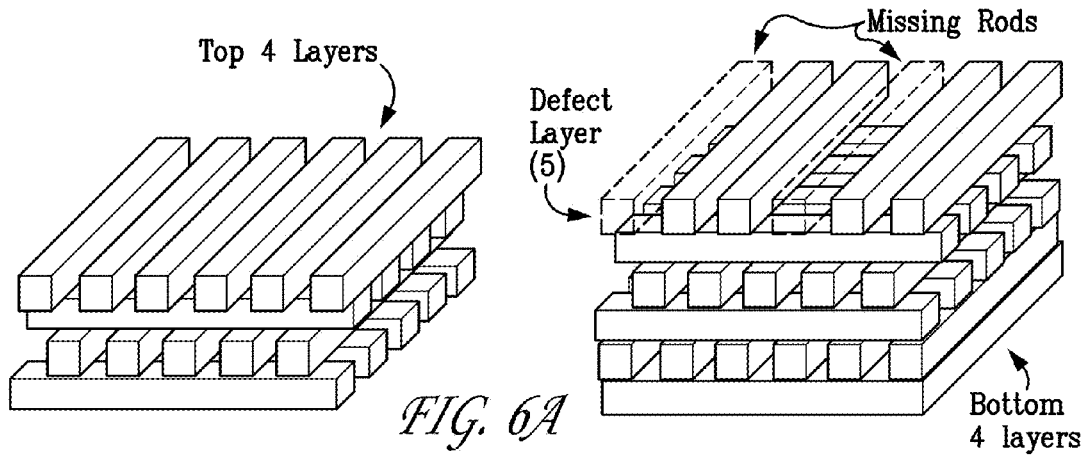
FIG. 6a is a schematic view of a cavity defect introduced in the 5$^{th}$ layer consisting of missing rods (indicated by dotted lines).
Figure 6B:
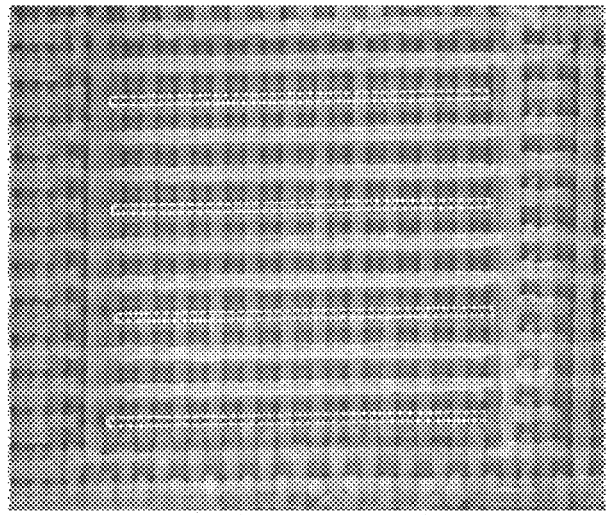
FIG. 6b is a top view SEM image of layer 5 of the logpile obtained through partial, focused ion beam (FIB) cut depicting a line defect cavity where every 3$^{rd}$ horizontal rod has been removed. The missing rods are indicated by white dashed stripe.
Figure 6C:
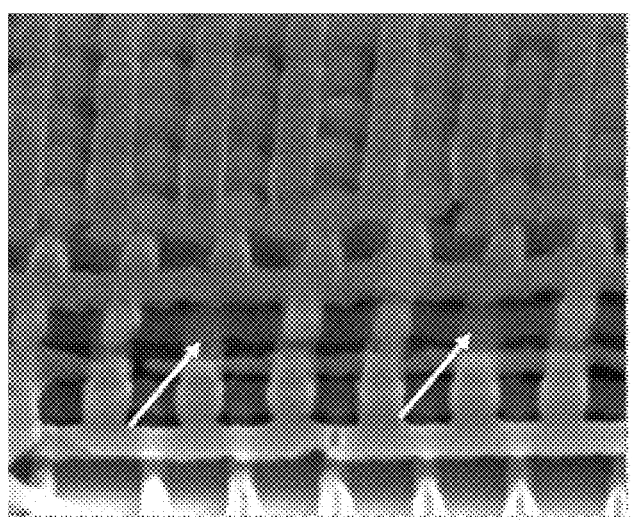
FIG. 6c is a cross sectional SEM image of the cavity structures. The white arrows point to the position of the missing rods.
Figure 7A:
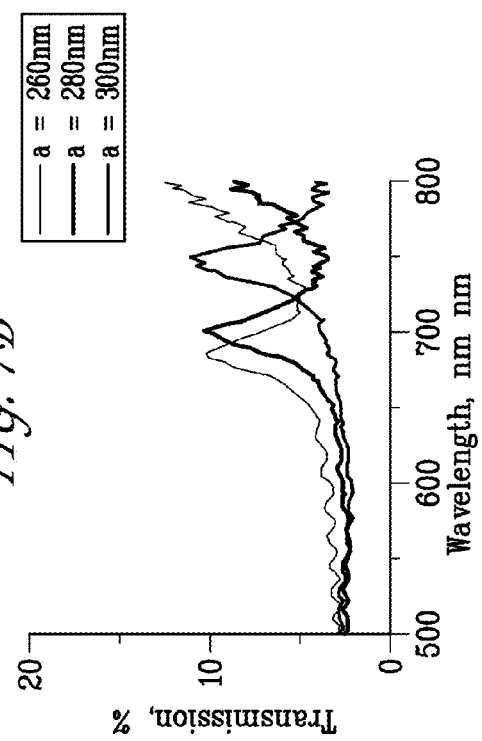
FIG. 7a is an optical reflectance spectrum of the line-defect cavity structures. A dip in the reflectance corresponding to the cavity mode appears at 730 nm, 695 nm and 685 nm for a=300 nm, 280 nm and 260 nm respectively.
Figure 7B:
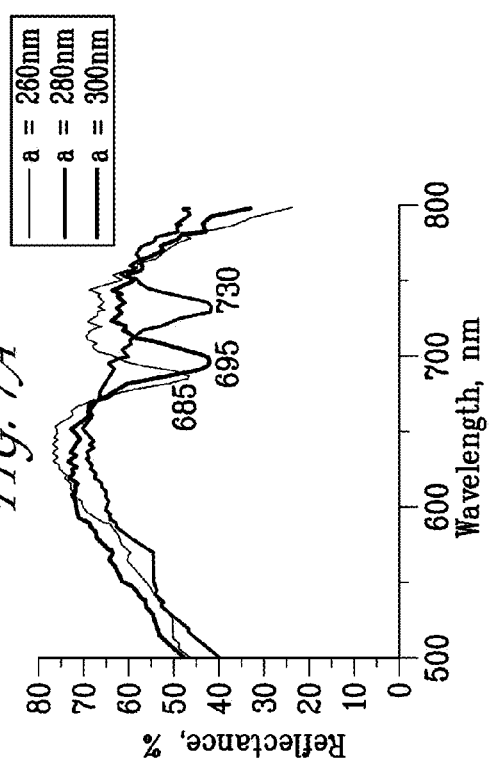
FIG. 7b is the corresponding transmission spectrum.
Figure 7C:
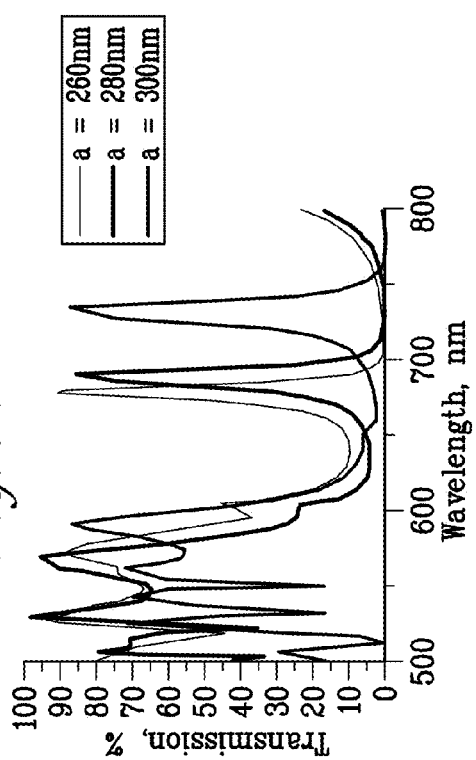
FIG. 7c is an FDTD simulation of the reflectance spectrum of the cavity structures.
Figure 7D:
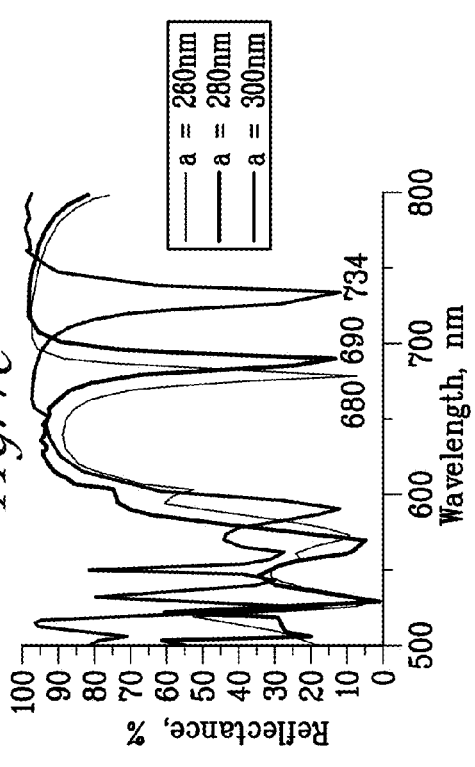
FIG. 7d is a simulation of the transmission spectrum.

Another approach to enhancing the PDOS is by utilizing defect cavity modes created within the photonic bandgap by breaking the periodicity of the PC through intentional defects. To demonstrate this, a "line-defect cavity" was fabricated by periodically removing an entire rod in the 5$^{th}$ layer of a 9 layer logpile structure. FIG. 6a shows a schematic illustration of the defect cavity structure, and FIGS. 6b and 6c show the top view and cross-sectional SEM image respectively, of such a cavity where every third rod is removed. The optical reflectance measurements show that the response of the cavity to the input light is highly polarization dependent (FIG. 7a). Thus, for light polarized parallel to the 5$^{th}$ layer rods a reflectance dip was observed within the bandgap appearing at wavelengths of 730 nm for a=300 nm, at 695 nm for a=280 nm, and at 685 nm for a=260 nm structures. FIG. 7b shows the corresponding transmission response, clearly indicating that transmission modes within the bandgap are opened up by the cavity. The measured quality factors are ~28, 26 and 29 for a=260, 280 and 300 nm. This indicates that frequency tunability of the cavity modes can be achieved by changing the lattice constant of the photonic crystal. FDTD simulation of the structure also shows reflectance dips/transmission peaks (FIG. 7c, d) associated with the cavity modes. The simulated reflectance dips (FIG. 7c) match the experimental dips quite closely in wavelength. However, the simulated dips are considerably deeper than the measured dips. Since quality factor (Q) is defined as $\lambda_{dip}/\Delta\lambda$, where $\Delta\lambda$ is the full width at half maximum (FWHM), the lower the dip in the reflectance, the smaller the FWHM. As a result, the corresponding calculated quality factors are also higher: ~68, 46 and 43 for a=260, 280 and 300 nm, respectively. The previously discussed explanation for the discrepancy in the reflectivity of the GaN logpile also explains the shallower cavity dips in the experimental data. Since the transmission and reflectance response do not add up to 100% and GaN does not have a significant absorption coefficient at these wavelengths, the observed losses are probably due to scattering. The small discrepancy in the cavity mode wavelength position can be attributed to differences between observed PC dimensions and the nominal values used for simulations.

Figure 8A:
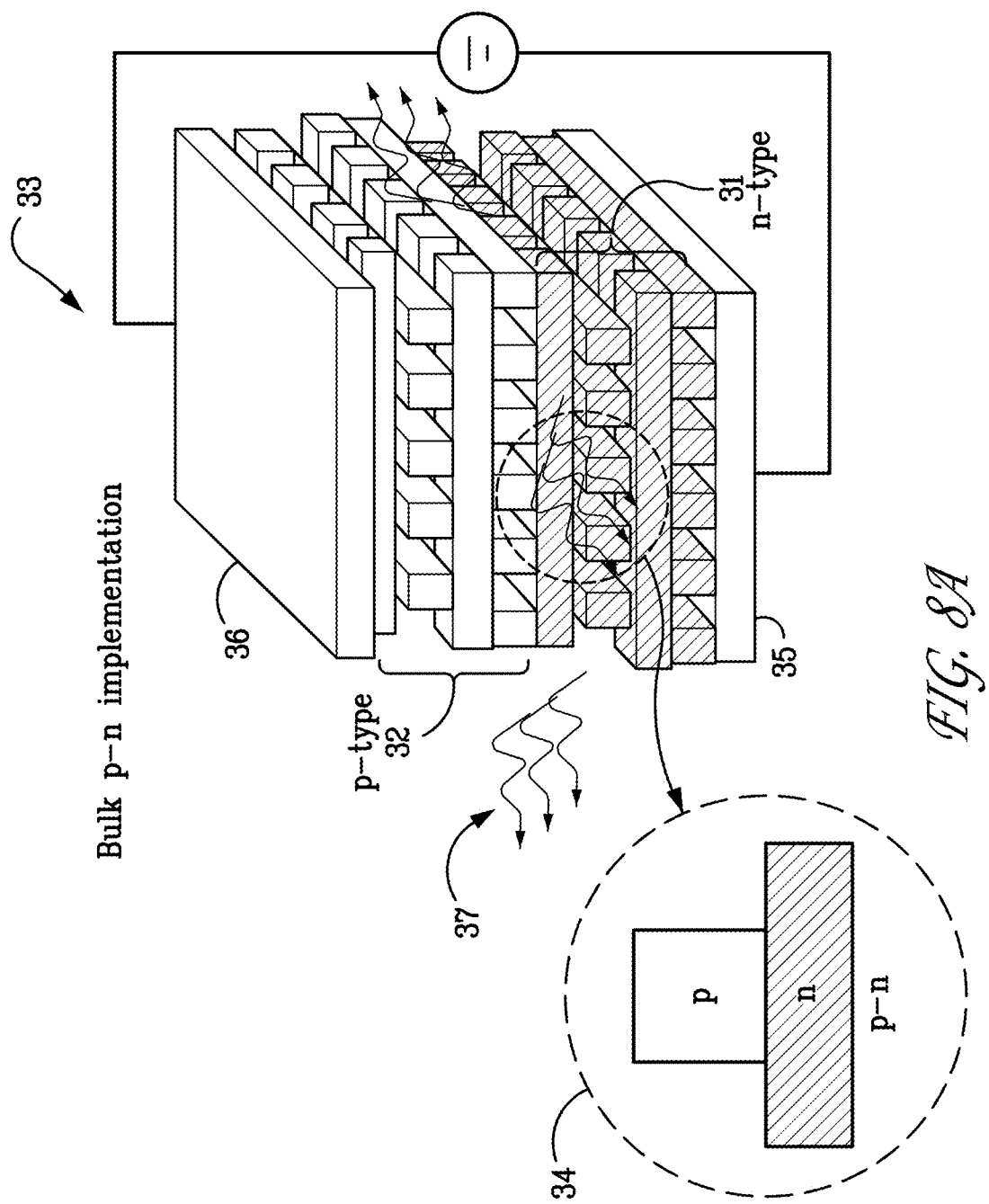
FIG. 8a shows an electrical injection scheme comprising a bulk p-n junction.
Figure 8B:
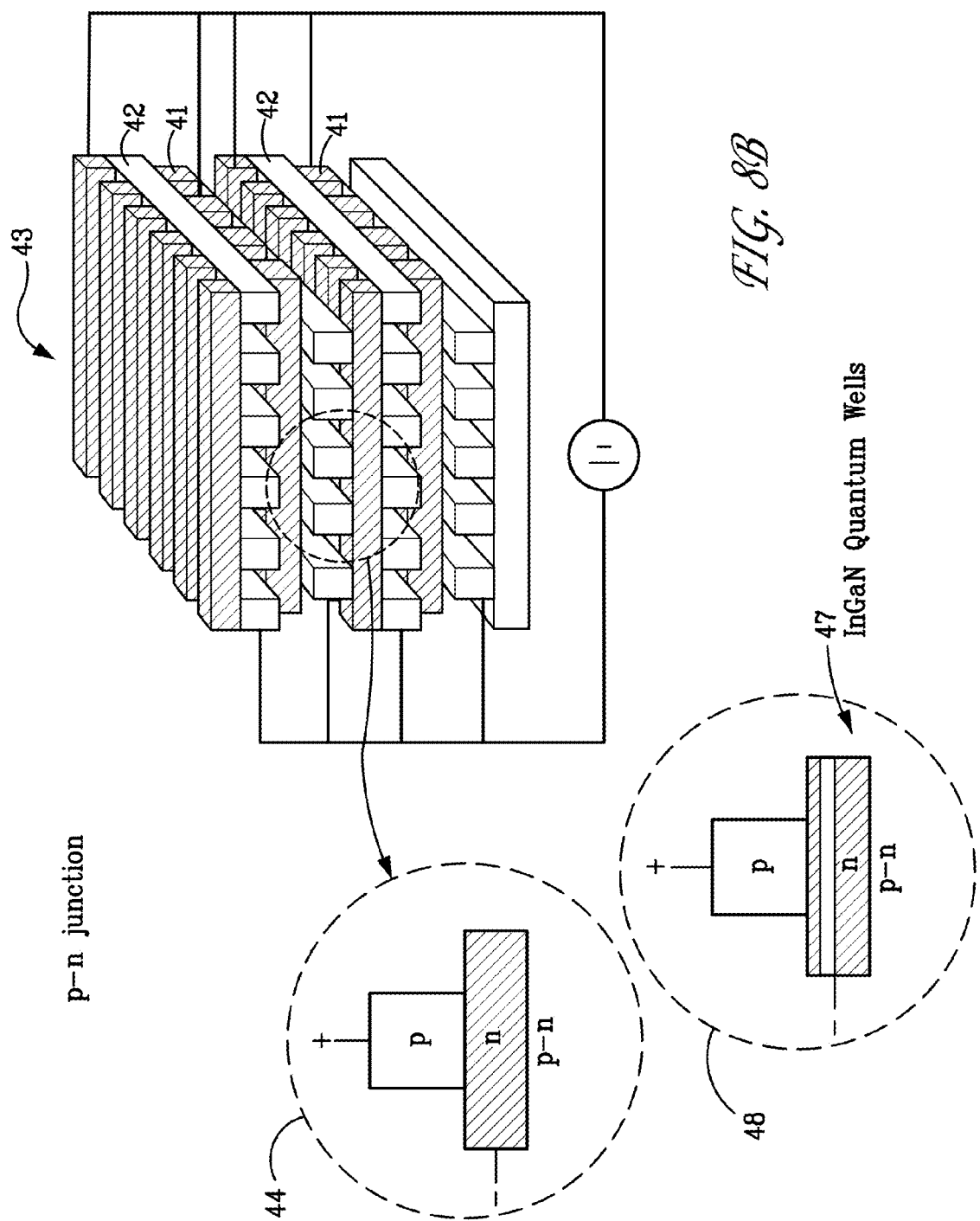
FIG. 8b shows an electrical injection scheme comprising alternate layers of p-type and n-type semiconductor forming a p-n diode junction.
Figure 8D:
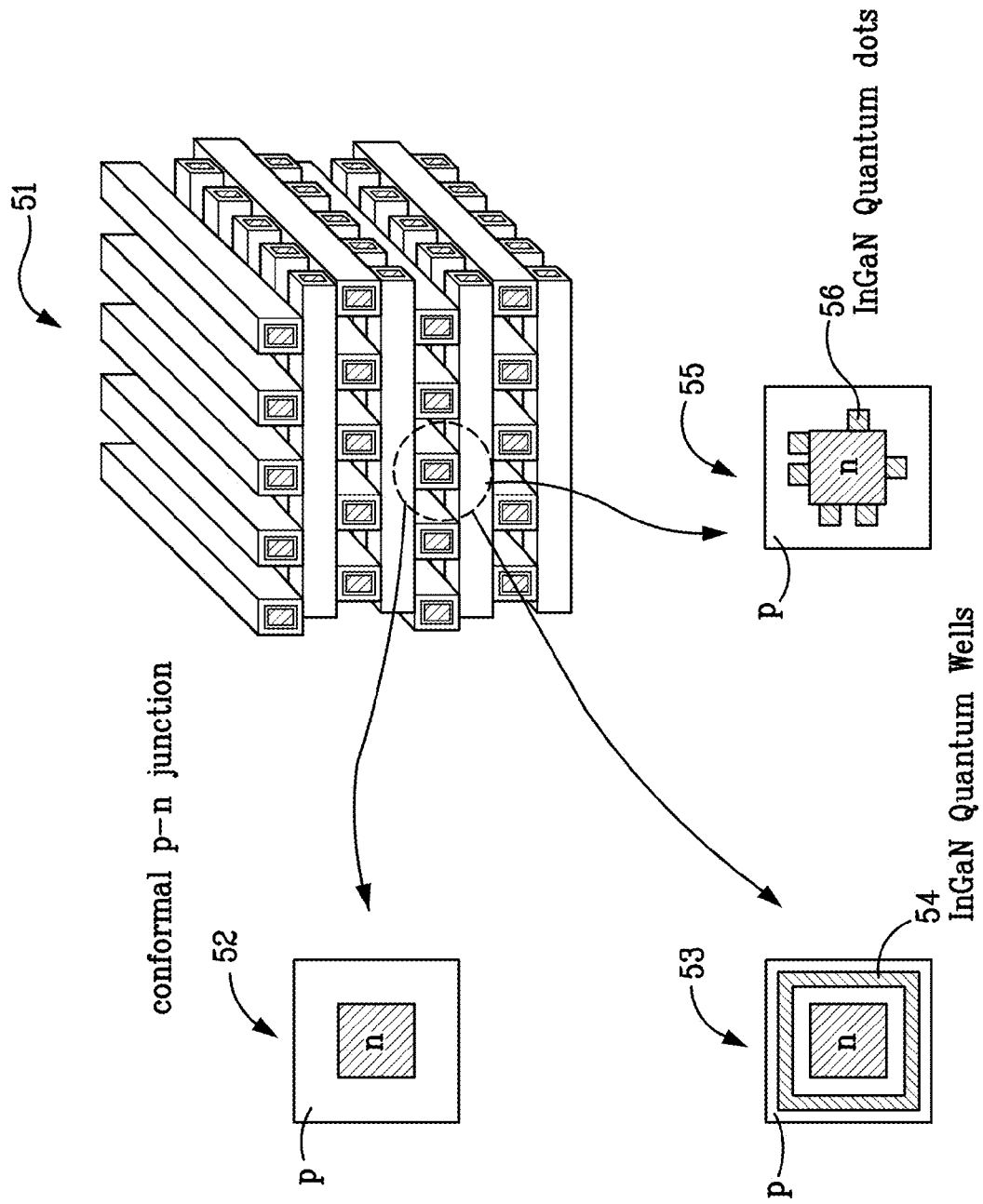
FIG. 8d shows an embodiment with a conformal p-n junction.

A p-n junction can be formed by introducing dopants, such as p-type and/or n-type dopants, into the growth reactor. For example, the doping type can be switched once in the middle of the DBG semiconductor growth to obtain a p-n junction at a desired location between a plurality of n-type layers 31 and a plurality of p-type layers 32 of a logpile 3DPC structure 33 to provide a bulk p-n junction 34, as shown in FIG. 8a. Electrode layers 35 and 36 can be provided at the bottom and top of the logpile 33 to enable biasing of and, therefore, light emission 37 from the p-n junction 34. In other embodiments, the doping type can be switched periodically and/or aperiodically during the growth process to produce more than one p-n junction within the volume of the 3DPC. For example, the doping type can be switched periodically to provide alternating layers of n-type 41 and p-type 42 semiconductor material within a logpile 3DPC 43, as shown in FIG. 8b. Suitable electrical contacts can be made to bias the alternating n- and p-type logpile layers 41 and 42 to provide at least one p-n diode junction 44 within the logpile structure 43. Alternatively, the alternating layers can be electrically biased to provide n-p-n transistor-like junctions 45 within a logpile structure 46, as shown in FIG. 8c. The latter n-p-n structure 45 addresses some of the current spreading problems associated with the p-type layer. Additional embodiments can use InGaN quantum well layers 47 embedded in the n- or p-logpile layers 41 or 42 of a p-n diode 48 or n-p-n transistor 49. The embedded quantum well layers 47 enable a choice of light emission wavelength by control of the InGaN composition and well thickness. FIG. 8d shows another logpile structure 51 wherein a p-type layer is grown conformally on top of the n-type rods after the n-type logpile is completely fabricated. Example 52 shows a simple p-n junction comprising a p-type conformal layer surrounding an n-type rod. Alternatively, the logpile can comprise p-type rods conformally coated with a n-type layer. Example 53 shows a conformally grown InGaN quantum well 54 within the p-type layer surrounding the n-type rod that enables selection of emission wavelength. Alternatively, the logpile can Example 55 shows InGaN quantum dots 56 grown within the conformal p-type layer. Alternatively, the quantum well layer or quantum dots can be grown at the interface between the p-type and n-type semiconductor layers. Using quantum dots 56 instead of quantum wells 54 may enable emission tuning to a longer wavelength emission color (e.g., yellow or amber). In addition to the emission enhancement achieved due to the enhanced PDOS, the 3DPC geometry uniquely enables the increase of light emission in a scalable manner by simply increasing the number of unit cells of 3DPC in the vertical (growth) direction.

As described above, by appropriately introducing dopants during the growth process, p-n junctions can be formed to create three-dimensional LED structures. These GaN-based LEDs can utilize the PDOS enhancement offered by 3DPCs to improve their performance. Since the 3DPC also consists of a continuous network of voids, phosphors can be introduced into the volume which can be pumped by emission from the GaN. This approach can be superior to pumping phosphor coated on the surface of a planar LED since one can take advantage of the radiative enhancement of emitters offered by the 3DPC. See G. Subramania et al., *Applied Physics Letters* 95, 151101 (2009).

Accordingly, various embodiments of the invention can provide wavelength tunability. In some embodiments, down-conversion of the emitted wavelength is possible. Since the emission wavelength of a DBG semiconductor is determined by the electronic bandgap of the material, only the wavelength associated with the particular bandgap of one of the DBG semiconductors is available. However, more emission wavelengths can be provided by introducing phosphors into the 3DPC structure. Examples of some suitable phosphors include but are not restricted to CdS, CdSe, PbS, PbSe, ZnSe and ZnS. The 3DPC can have a band edge at a higher photon energy corresponding to the photoexcitation energy of the phosphor. Therefore, the electrically pumped 3DPC can emit at the photoexcitation energy and the phosphor can absorb this radiation and remit at a longer wavelength characteristic of the emission spectrum of the phosphor. For example, the phosphors can be incorporated into the 3DPC structure as semiconductor quantum dots. In some embodiments, the phosphors can be introduced into the porous region of the 3DPC where the local PDOS can be higher by using aerogel as an ultralow refractive index matrix.

Wavelength tuning can also be achieved by the introduction of microcavities and/or nanocavities which create a transmission mode within the photonic bandgap. These defect cavities can be infiltrated with a suitable phosphor to emit a desired wavelength. A very wide range of cavity geometries can be employed in various embodiments of this invention. In embodiments where the cavities have a high quality factor and low mode volume, the emission rate (and consequently the brightness) can be even further increased utilizing the Purcell effect. The Purcell factor ($F_p$) describes the increase in the spontaneous emission rate due to the confinement of an emitter in an optical cavity with a large quality factor (Q) and a low mode volume (V) given by the following expression:

$$F_P = \frac{3}{4\pi^2}\frac{\lambda^3}{V}Q.$$

The present invention has been described as a volume-scalable high-brightness three-dimensional visible light source. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A light source comprising:
a three-dimensional photonic crystal having a photonic density of states, wherein the three-dimensional photonic crystal comprises at least one semiconductor with a direct bandgap and wherein at least one p-n junction is located within the three-dimensional photonic crystal; and
electrical contacts configured to produce electrical biasing of the at least one p-n junction to provide emission of light by recombination of electrical carriers at the p-n junction;
wherein the emission comprises a light spectrum suitable for modification by the photonic density-of-states of the three-dimensional photonic crystal.

2. The light source of claim 1, wherein the three-dimensional photonic crystal comprises a face-centered-cubic (FCC), inverse FCC, diamond, inverse diamond, simple cubic (SCC), inverse SCC, body-centered-cubic (BCC), inverse BCC, or hexagonal (HCP) crystal structure.

3. The light source of claim 1, wherein the three-dimensional photonic crystal comprises an opal, an inverse opal, a logpile, or an inverse logpile crystal structure.

4. The light source of claim 1, wherein the at least one semiconductor with a direct bandgap comprises a group III nitride semiconductor.

5. The light source of claim 1, wherein the at least one semiconductor with a direct bandgap comprises GaN, AlGaN, InGaN, InN, AlN, GaAs, InGaAs, AlGaAs, CdS, CdSe, ZnS, ZnSe, InP, InAs, GaSb, InSb, or ZnO.

6. The light source of claim 1, further comprising at least phosphor in the three-dimensional photonic crystal.

7. The light source of claim 6, wherein the at least one phosphor comprises CdS, CdSe, PbS, PbSe, ZnSe, or ZnS.

8. The light source of claim 1, further comprising a cavity defect in the three-dimensional photonic crystal providing a transmission mode within a photonic bandgap of the photonic crystal.

9. The light source of claim 1, wherein the three-dimensional photonic crystal comprises a logpile structure.

10. The light source of claim 9, wherein the logpile structure comprises a p-n junction at a desired location between a plurality of n-type semiconductor layers and a plurality of p-type semiconductor layers to provide a bulk p-n junction.

11. The light source of claim 9, wherein the logpile structure comprises alternating n-type and p-type semiconductor layers.

12. The light source of claim 11, wherein at least one of the alternating n-type and p-type semiconductor layers are electrically biased to provide at least one p-n diode junction.

13. The light source of claim 11, wherein at least one of the alternating n-type and p-type semiconductor layers are electrically biased to provide at least one n-p-n transistor-like junction.

14. The light source of claim 11, wherein at least one of the n-type or p-type semiconductor layers further comprises a quantum well layer.

15. The light source of claim 9, wherein the logpile structure comprises n-type semiconductor rods conformally coated with a p-type semiconductor layer.

16. The light source of claim 15, wherein the conformal p-type semiconductor layer further comprises a quantum well layer.

17. The light source of claim 15, wherein the conformal p-type semiconductor layer further comprises a plurality of quantum dots.

18. The light source of claim 9, wherein the logpile structure comprises p-type semiconductor rods conformally coated with a n-type semiconductor layer.

19. The light source of claim 18, wherein the conformal n-type semiconductor layer further comprises a quantum well layer.

20. The light source of claim 18, wherein the conformal n-type semiconductor layer further comprises a plurality of quantum dots.

* * * * *